United States Patent [19]
Yung et al.

[11] Patent Number: 5,504,465
[45] Date of Patent: Apr. 2, 1996

[54] MICROWAVE MODULATOR HAVING ADJUSTABLE COUPLERS

[75] Inventors: Ming L. Yung, Los Altos; Bernard M. Albrecht, Jr., Sunnyvale; Andrew M. Kennedy, II, Oakland; Elizabeth C. Townley, Campbell, all of Calif.

[73] Assignee: Space Systems/Loral, Inc., Palo Alto, Calif.

[21] Appl. No.: 293,796

[22] Filed: Aug. 22, 1994

Related U.S. Application Data

[63] Continuation of Ser. No. 977,679, Nov. 18, 1992, abandoned.

[51] Int. Cl.$^6$ .................. H03C 3/00; H01P 1/00; H01P 5/18; H04L 27/20
[52] U.S. Cl. .................. 332/145; 332/105; 333/81 R; 333/81 A; 333/109; 330/54; 375/308; 455/42; 455/111; 455/325
[58] Field of Search .................. 332/103, 120, 332/146, 144, 105, 145; 333/81 R, 81 A, 117, 109, 116; 455/42, 110, 111, 325; 375/279, 308; 330/54

[56] References Cited

U.S. PATENT DOCUMENTS

| | | | |
|---|---|---|---|
| 3,440,570 | 4/1969 | Kasper | 333/10 |
| 3,673,492 | 6/1972 | Gilson | 333/81 A X |
| 3,745,250 | 7/1973 | Gerst | 332/144 X |
| 3,745,250 | 7/1973 | Gerst | 178/88 |
| 3,755,739 | 8/1973 | Okano | 325/163 |
| 3,924,206 | 12/1975 | Fassett | 333/81 R |
| 4,153,886 | 5/1979 | Miedema | 333/156 |
| 4,216,445 | 8/1980 | Abajian | 333/81 R |
| 4,276,521 | 6/1981 | Davidheiser | 332/23 R |
| 4,352,071 | 9/1982 | Childs et al. | 333/116 X |
| 4,395,687 | 7/1983 | Belohoubek | 333/164 |
| 4,717,894 | 1/1988 | Edwards et al. | 332/20 |
| 4,726,039 | 2/1988 | Piesinger | 375/67 |
| 4,736,170 | 4/1988 | Wu et al. | 332/21 |
| 4,788,509 | 11/1988 | Bahl et al. | 330/54 |
| 4,823,096 | 4/1989 | Hash | 333/109 |
| 4,978,932 | 12/1990 | Gupta et al. | 333/81 R |
| 5,006,811 | 4/1991 | Kruger | 329/354 |
| 5,349,312 | 9/1994 | Huettner et al. | 333/81 A |

FOREIGN PATENT DOCUMENTS

| | | | |
|---|---|---|---|
| 2056347 | 5/1971 | Germany. | |
| 59-100601 | 9/1984 | Japan | 333/81 A |
| 61-222309 | 2/1986 | Japan. | |

*Primary Examiner*—Robert Pascal
*Assistant Examiner*—Arnold Kinkead
*Attorney, Agent, or Firm*—Perman & Green

[57] ABSTRACT

A multifunction microwave modulator circuit has an input signal splitter to provide two equal amplitude signal components. A phase quadrature relationship between the two signal components is obtained by constructing the splitter as a Lange coupler. There is pair of circuit cells, each of which operates separately on one of the two signal components to electronically adjust a vector representation of the signal to provide a vector having a desired amplitude, ranging over both positive and negative values of amplitude, including zero amplitude. The signal vectors of the two cells are combined by means of a Wilkinson combiner to provide an output signal represented by a resultant vector which may have any direction within 360 degrees, and an amplitude scale factor which varies from unity to zero. Each circuit cell has a Lange coupler with output terminals terminated with an impedance, such as back-biased transistors, variable in response to a control voltage to reflect power via a second input terminal to the Wilkinson combiner. The circuit may be operated in reciprocal fashion by applying an input microwave signal to the Wilkinson combiner and extracting the output signal from the Lange coupler of the power splitter.

16 Claims, 3 Drawing Sheets

MICROWAVE MODULATOR HAVING ADJUSTABLE COUPLERS

This is a continuation of application Ser. No. 07/977,679 filed on Nov. 18, 1992, now abandoned.

BACKGROUND OF THE INVENTION

This invention relates to a microwave modulator capable of both amplitude and phase modulation and, more particularly, to the use of plural couplers with electronically adjustable terminating resistors to provides for a full 360 degrees of phase shift and a capacity for varying amplitude through zero amplitude, the amplitude and the phase being independently adjustable to allow the modulator to be used also as a phase shifter and an attenuator, as well as for a single side-band up-converter and down-converter.

Various forms of microwave phase shifters and attenuators are known. The phase shifters may be formed of a set of pin diodes, by way of example, for electronic phase shifting as well as for phase modulation. Mechanical devices, such as movable vanes, by way of example, may be employed in the construction of both phase shifters and attenuators and, by moving the vanes either manually or by motors, phase shift and/or attenuation may be varied, and a slow modulation of phase and/or amplitude may be attained.

A problem arises in that in modern signal processing and communication systems, rapid phase shift and amplitude variations may be required, and phase shifts through a range of 360 degrees may be desired. It is advantageous, furthermore, if a single device capable of providing the foregoing modulations can be used also as an up-converter or down-converter of a carrier frequency of a microwave signal. Presently available circuitry does not provide all of these functions.

SUMMARY OF THE INVENTION

The aforementioned problem is overcome and other advantages are provided, in accordance with the invention, by a microwave circuit comprising a pair of circuit cells each of which operates separately on an input sinusoidal signal, such as a microwave signal, to electronically adjust a vector representation of the signal to provide a vector having a desired amplitude, ranging over both positive and negative values of amplitude, including zero amplitude. The signal vectors of the two cells are combined to provide an output signal. The signals processed by the circuit cells are offset in phase from each other by 90 degrees, prior to a combination of the two vector components of the output signal so that the two vectors are directed along perpendicular axes. Summation of the two vectors produces a resultant vector which may have any direction within 360 degrees, and an amplitude scale factor which varies from unity to zero.

In accordance with a feature of a preferred embodiment of the invention, each circuit cell comprises a Lange coupler having two input terminals and two output terminals. A signal applied to one of the input terminals appears at both of the output terminals, due to a splitting of the input power among the two output terminals, and may be reflected back to the second of the input terminals depending on the impedance of a loading at each of the output terminals. For example, if both of the output terminals are terminated with an impedance matched to the characteristic impedance of a microwave transmission line employed in fabricating the Lange coupler, then there is zero reflected power at the second input terminal. If a greater value of terminating impedance is employed, a reflected signal of a first polarity is obtained at the second input terminal. If a lesser value of terminating impedance is employed, a reflected signal of a second polarity, opposite the first polarity, is obtained at the second input terminal. The magnitude of the reflected signal increases with increasing departure of the value of the terminating loads at the two output terminals from the matched impedance.

In a preferred embodiment of the invention, the loading of the two output terminals of the Lange coupler in each of the circuit cells is accomplished by use of field-effect transistors (FETs) activated with a bias voltage for operation as resistors having a value of resistance dependent on the value of the bias voltage. Thus, the loading of the two output terminals of the Lange coupler is selectable and adjustable electronically by adjustment of the bias voltage applied across the gate-source junction of each FET. One bias voltage is applied to the two FETs in one circuit cell and a second bias voltage is applied to the two FETs in the second circuit cell. Thus, only two control signals are required to operate the modulator of the invention. A variation in values of the control signals introduces a phase and/or amplitude modulation, while fixed values of the control signals provide the functions of phase-shift and/or attenuation. Sinusoidal variations in control signal can provide the function of up-conversion or down-conversion in carrier frequency of a signal processed by the modulator. The components of the modulator are constructed readily of coplanar waveguide in microstrip form on a common substrate with the FETs to provide the structure of a monolithic microwave integrated circuit. While the preferred embodiment of the invention is directed to microwave signals, the principles of the invention are applicable also to lower frequency signals.

BRIEF DESCRIPTION OF THE DRAWING

The aforementioned aspects and other features of the invention are explained in the following description, taken in connection with the accompanying drawing wherein.

DETAILED DESCRIPTION

Figure 1:
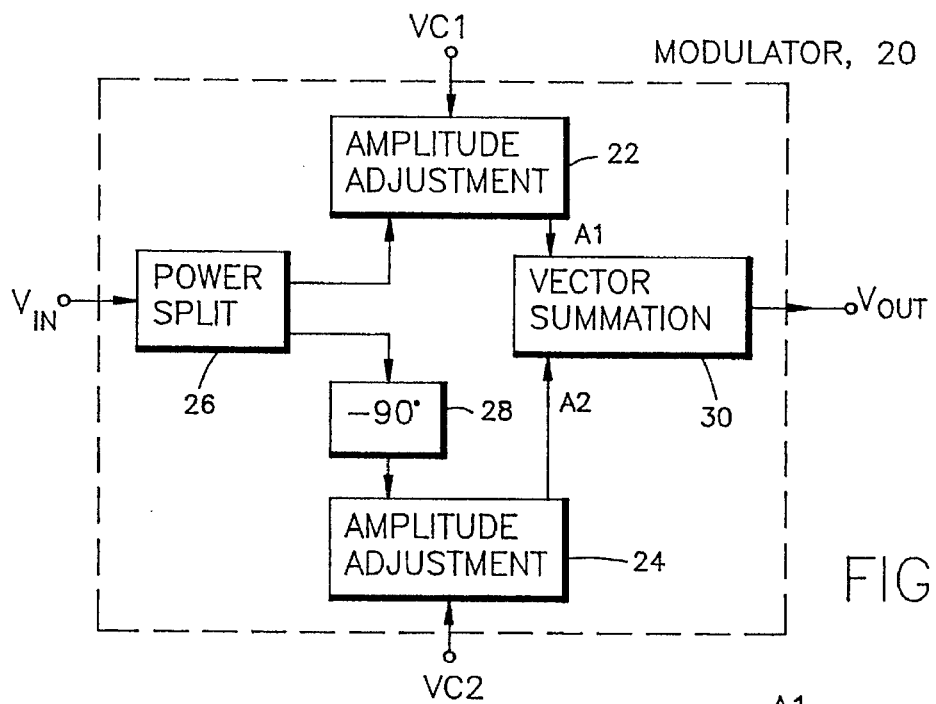
FIG. 1 is a diagrammatic view showing interconnection of major components of the modulator of the invention.
Figure 2:
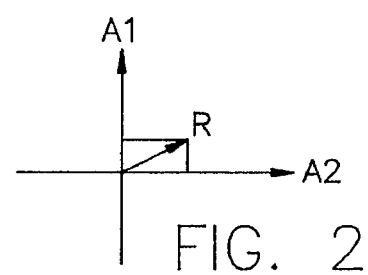
FIG. 2 is a vector diagram useful in explaining operation of the modulator of FIG. 1.

With reference to FIGS. 1 and 2, a modulator 20 is constructed in accordance with the invention and includes two circuit cells serving as amplitude adjustment units 22 and 24, an input power splitter 26 coupled directly to the adjustment unit 22 and via a phase shifter 28 to the adjustment unit 24, and a vectorial summation unit 130 which sums together output signals of the adjustment units 22 and 24. An input microwave signal $V_{in}$ of the modulator 20 is applied to an input terminal of the power splitter 26. An output microwave signal $V_{out}$ of the modulator 20 is outputted from an output terminal of the summation unit 30. The power splitter 26 divides the power of the input signal equally between the adjustment units 22 and 24. The phase shifter 28 introduces a phase lag of 90 degrees to offset the phases of the signals applied to the two adjustment units 22 and 24.

The operation of the modulator 20 may be explained by assuming signals of unity amplitude to be applied by the power splitter 26 to the adjustment units 22 and 24. In accordance with the magnitudes of control signals $V_{c1}$ and $V_{c2}$ applied respectively to control terminals of the adjustment units 22 and 24, the amplitudes of the signals are attenuated to values $A_1$ and $A_2$ respectively at output terminals of the adjustment units 22 and 24, to be applied to the summation unit 30. Since the microwave signals $A_1$ and $A_2$ are in phase quadrature, they may be represented by the vertical and the horizontal coordinates of the diagram of FIG. 2 for vector addition to produce a resultant vector R representing the output signal $V_{out}$. A change in the amplitude of one or both of the control signals $V_{c1}$ and $V_{c2}$ produces a corresponding change in the amplitude, and possibly also the sense, of one or both of the vectors $A_1$ and $A_2$. Thus, the vector R may lie in the first quadrant, as shown, or in the second quadrant for a negative value of $A_2$, or in the third quadrant for a negative value of both $A_1$ and $A_2$, or in the fourth quadrant for a negative value of $A_1$. In this way, the resultant vector R may have any phase angle within the range of 360 degrees, and the amplitude of R can vary between zero and 1.4 (square root of 2).

The microwave circuitry of the modulator 20 operates in reciprocal fashion, as will be described hereinafter, and accordingly the input and the output terminals of the modulator 20 can be reversed with the input signal $V_{in}$ being applied to the output terminal, and the output signal $V_{out}$ being obtained from the input terminal. With such reversal of terminals, the modulator takes the form shown in FIG. 3.

Figure 3:
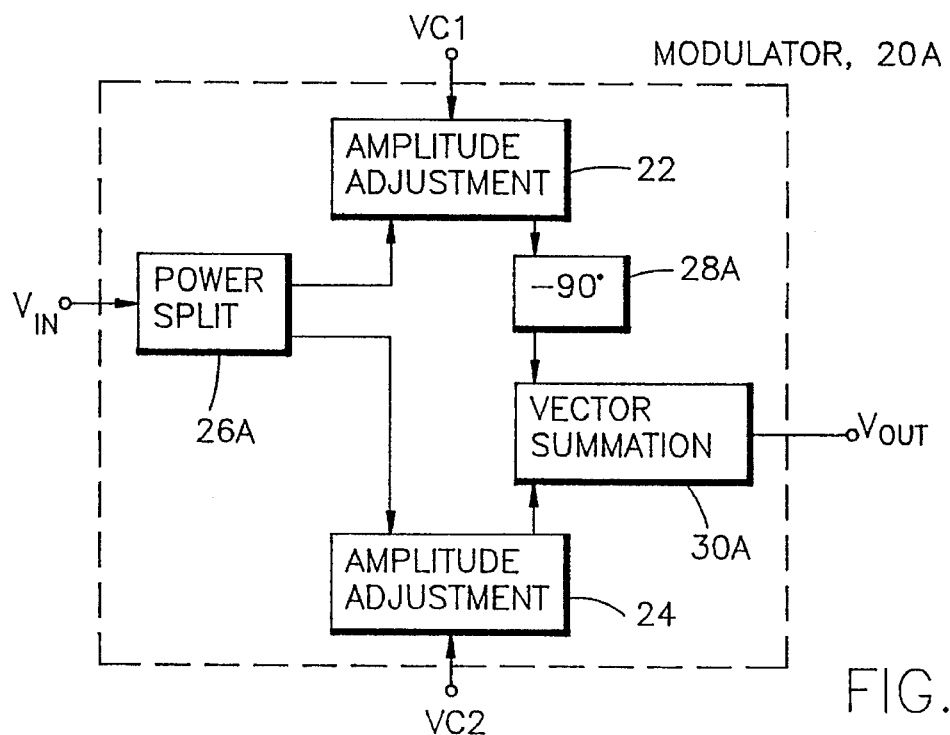
FIG. 3 is a diagrammatic view of an alternative representation of the modulator of FIG. 1 obtained by interchanging input and output terminals of the modulator depicted in FIG. 4.

FIG. 3 shows a modulator 20A which is an alternative representation of the modulator 20 of FIG. 1. In FIG. 3, the modulator 20A comprises the two adjustment units 22 and 24, a phase shifter 28A which functions in the same fashion as the phase shifter 28, a power splitter 26A which functions in the same fashion as the power splitter 26, and a vector summation unit 30A which functions in the same fashion as the summation unit 30. The modulator 20A functions in a manner analogous to the operation of the modulator 20 by splitting the input signal power evenly at the splitter 26A for application to the adjustment units 22 and 24. The adjustment units 22 and 24 attenuate the signals from the splitter 26A and provide a desired sense to the vectors (positive or negative) in response to the control signals $V_{c1}$ and $V_{c2}$. The vector quantities outputted by the adjustment units 22 and 24 are placed in phase quadrature by the phase shifter 28A, and then are summed vectorially by the summation unit 30A.

Figure 4:
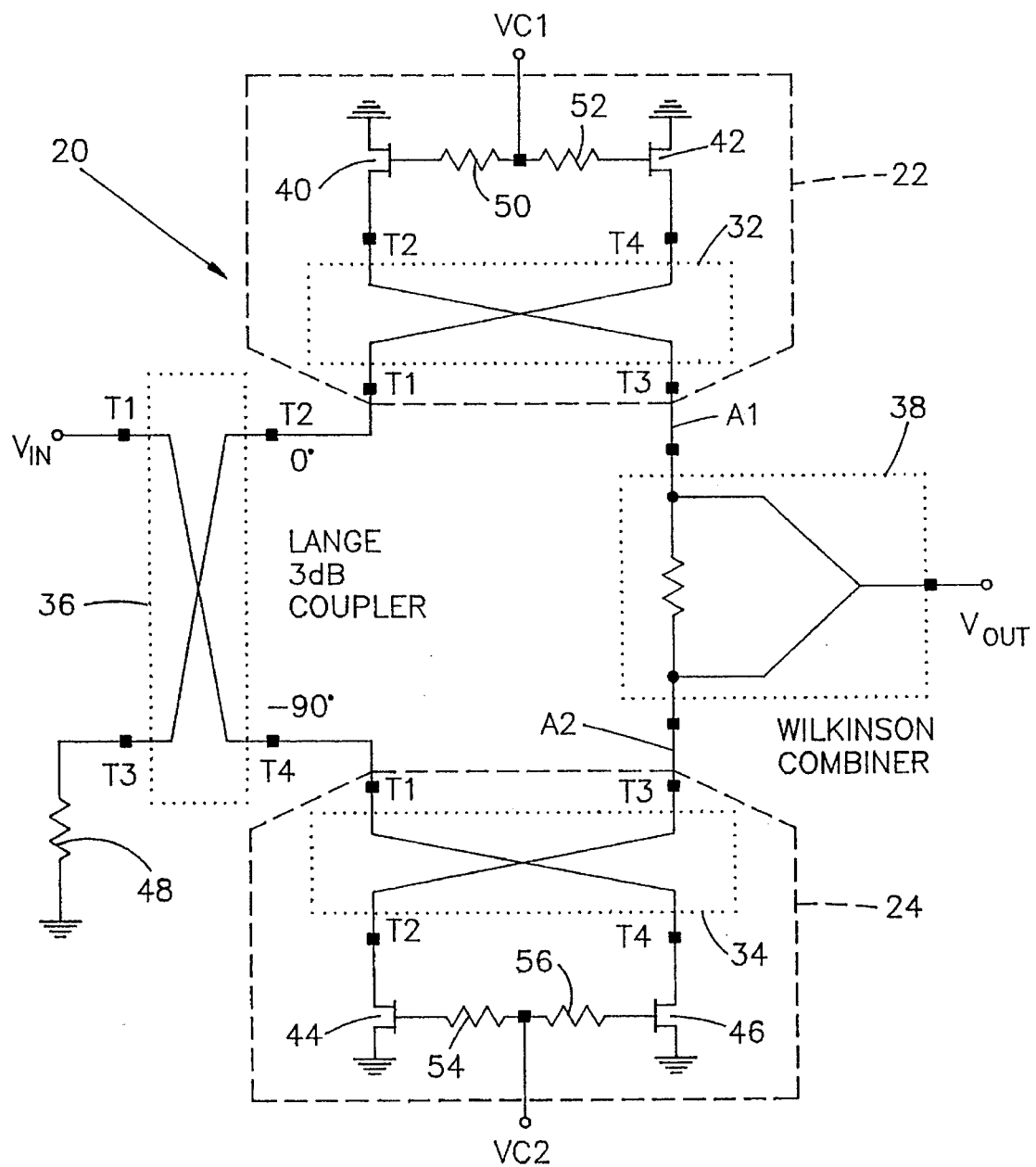
FIG. 4 is a schematic diagram showing details in the construction of the modulator of FIG. 1.

FIG. 4 shows details in the construction of the modulator 20. The modulator 20 comprises three Lange couplers 32, 34 and 36, a Wilkinson coupler 38, four field-effect transistors 40, 42, 44 and 46, a resistor 48 for terminating an input terminal of the coupler 36, and four resistors 50, 52, 54 and 56 which connect gate terminals of the transistors 40, 42, 44, and 46, respectively, to control voltages. The coupler 32 in concert with the transistors 40, 42 and the resistors 50, 52 provide the function of the amplitude adjustment unit 22 (FIGS. 1, 3). The coupler 34 in concert with the transistors 44, 46 and the resistors 54, 56 provide the function of the amplitude adjustment unit 24 (FIGS. 1, 3). Each of the couplers 32, 34 and 36 are constructed as 3 dB (decibel) couplers for equal division of power among output terminals of the coupler. Each of the couplers 32, 34 and 36 has two input terminal T1 and T3, and two output terminals T2 and T4.

In the operation of the modulator 20, a Lange coupler, such as any one of the couplers 32, 34 and 36, couples electromagnetic power between terminals T1 and T2 with zero degrees of phase shift, as is well known, but introduces a phase shift of 90 degrees, lag, for power coupled between terminals T1 and T4. Therefore, the coupler 36 provides the functions of both the power splitter 26 and the phase shifter 28 (FIG. 1). The coupler 36 applies equal amounts of power to both the couplers 32 and 34 via connection T2 of coupler 36 to T1 of coupler 32 and connection T4 of coupler 36 to T1 of coupler 34. Due to the 90 degree phase lag between signals of terminals T4 and T2 of coupler 36, the signals applied to the couplers 32 and 34 are in phase quadrature. Also, as is well known in the operation of a Lange coupler, a signal applied at the the input terminal T1 is totally absorbed by loads at the output terminals T2 and T4 when the loads are matched to the characteristic impedance of the microwave transmission line employed in fabricating the coupler, but is reflected back, at least partially, to both of the input terminals T1 and T3 when the loads are not matched. The resistor 48 is a matched load for absorbing any power reflected to terminal T3.

In the amplitude adjustment unit 22, each of the transistors 40 and 42 is operated as a resistor. This is accomplished by grounding the source terminals, and by placing a negative voltage bias upon the gate terminals of the transistors 40 and 42. The control voltage $V_{c1}$ has a value in the range of 0.0 to −3.0 volts, and serves as the bias voltage. The resistors 50 and 52, in addition to coupling the bias voltage to the transistors 40 and 42, respectively, also serves to decouple the electromagnetic power of the coupler 32 from the $V_{c1}$ terminal of the adjustment unit 22. In a preferred embodiment of the invention, each of the resistors 50 and 52 has a value of 20,000 ohms, and the characteristic impedance of transmission lines employed in the construction of the modulator 20 has a value of 50 ohms. For near zero values of bias voltage, the transistors 40 and 42 present a resistive impedance loading of less than 50 ohms, a minimum value of resistance being as low as approximately 5 ohms. For values of bias voltage approaching the maximum value of three volts, the transistors 40 and 42 present a resistive impedance loading of more than 50 ohms, a maximum value of resistance being as high as approximately 10,000 ohms. The value of resistance tends to increase exponentially with the magnitude of the bias voltage.

By way of example in the construction of the invention, the preferred embodiment employs coplanar waveguide in stripline form with all components of the modulator 20 disposed on a single substrate. All four of the transistors 40, 42, 44 and 46 are formed of gallium arsenide with a gate width in the range of approximately 300–500 microns. Operating frequency is in the range of approximately 6.5 GHz (gigahertz) to 9.5 GHz.

In the operation of the amplitude adjustment unit 22, upon presentation of a microwave signal at terminal T1 of the coupler 32, no power is reflected back to the terminal T3 in the situation wherein the transistors 40 and 42 provide matched loads of 50 ohms to the terminals T2 and T4 of the coupler 32. The transistors 40 and 42 are fabricated as a matched pair so as to provide equal values of resistance. In the situation wherein the transistors 40 and 42 provide a mismatched loading to the terminals T2 and T4, such that the resistance is either greater than or less than the 50 ohms, microwave power is reflected back to the terminal T3. However, in the case of the transistors 40 and 42 providing resistance less than the 50 ohms, the microwave signal outputted at terminal T3 is 180 degrees out of phase with the microwave signal outputted at terminal T3 in the case of the transistors 40 and 42 providing resistance greater the 50 ohms. Therefore, in the representation of the microwave signal at terminal T3 by the vector A1, the vector A1 has a positive sense for values of resistance of the transistors 40 and 42 greater than the matched loading of 50 ohms, and a negative sense for values of resistance of the transistors 40 and 42 less than the matched loading of 50 ohms. In this way, by varying the control voltage $V_{c1}$ through its range of 0 volts to −3 volts, the vector A1 is varied from a relatively large negative value through zero value to a relatively large positive value.

The construction and the operation of the amplitude adjustment unit 24 are identical to that just described for the adjustment unit 24. Thus, by varying the control voltage $V_{c2}$ through its range of 0 volts to −3 volts, the vector A2 is varied from a relatively large negative value through zero value to a relatively large positive value. As noted above, the microwave signals of the two adjustment units 22 and 24 are in phase quadrature. Accordingly, in the vector representation of the signals, the vectors A1 and A2 are portrayed on orthogonal axes as has bee disclosed in FIG. 2 for generating the resultant vector R. The output signal of terminal T3 of the coupler 32 and the output signal of the coupler 34 are applied to input terminals of the Wilkinson combiner 38 to provide a resultant microwave signal at the $V_{out}$ terminal which is represented by the vector R. In this way, the combiner 38 provides the function of the vector summation unit 30 (FIG. 1).

The modulator 20 is operative in reciprocal fashion such that a signal inputted to the output terminal of the combiner 38 is modulated in the same fashion and is then outputted from the terminal T1 of the coupler 36. This reciprocal operation is represented, as described above, by the modulator 20A of FIG. 3 wherein the function of the power splitter 26A is provided by the combiner 38, and the functions of the summation unit 30A and the phase shifter 28A are provided by the coupler 36.

Figure 5:
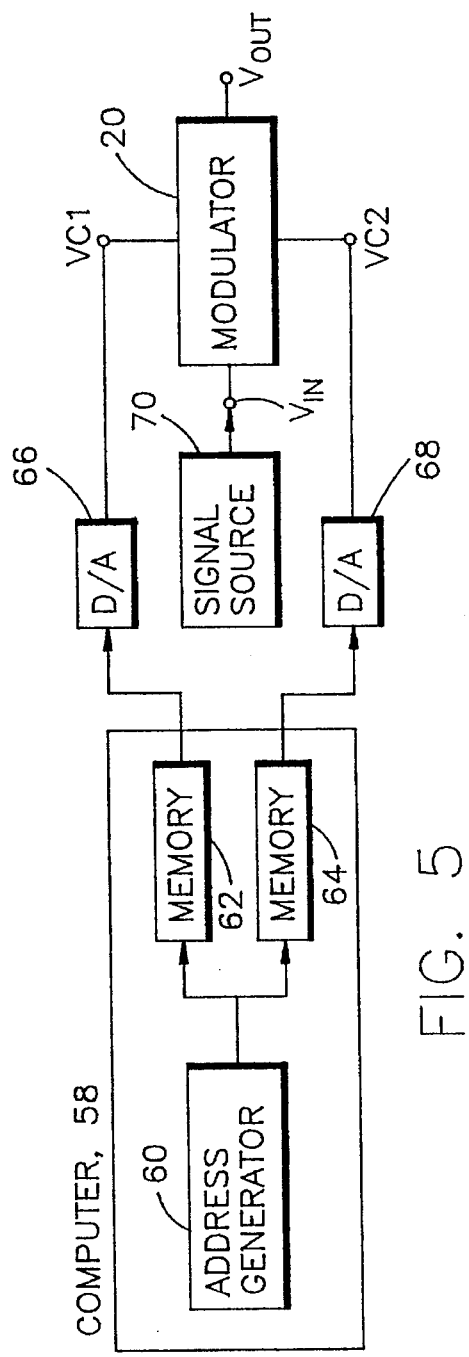
FIG. 5 is a block diagram showing connection of computer generated control signals to the modulator.

FIG. 5 shows, by way of example, application of control signals $V_{c1}$ and $V_{c2}$ to the modulator 20 by means of a computer 58. The computer 58 is a digital computer and includes an address generator 60, and two memories 62 and 64 which are addressed by the address generator 60. Digitally formatted output signals of the memories are coupled via digital-to-analog converters 66 and 68, respectively, to provide analog control signals $V_{c1}$ and $V_{c2}$ to the modulator 20. A source 70 of microwave signal provides the microwave signal $V_{in}$ to the modulator 20. In operation, the memories 62 and 64 may be read-only memories storing digitally formatted signals representing a sequence of voltage values to be applied as bias signals to the transistors of the adjustment units 22 and 24 (FIG. 4). For example, if it is desired to provide a phase ramp modulation to the microwave signal, wherein the phase angle of the vector R (FIG. 2) increases linearly with time, the values of voltage stored in the memories 62 and 64 are those required to provide the requisite values of resistance in the transistors of the adjustment units 22 and 24 which, in turn, provide the values of the vectors $A_1$ and $A_2$ which give the desired orientation to the vector R. The requisite values of voltage may be determined experimentally, as by manual adjustment of a pair of voltage sources (not shown), for each of numerous values of phase shift and, then, stored in the memories 62 and 64. Alternatively, several values of bias voltage may be determined experimentally for a specific amplitude of output signal of the modulator 20, and other values of bias voltage lying between the experimentally determined values may be found by an interpolation procedure of the computer 58. Programs for interpolation of tabulated values are well known. In a similar way, values of voltage may be stored in the computer memories for generating a specific waveform of amplitude modulation, or to provide both amplitude and phase modulation. By applying a single fixed value of voltage to the $V_{c1}$ control terminal and a single fixed value of voltage to the $V_{c2}$ control terminal, the circuitry of the modulator 20 functions as a phase shifter and/or an amplitude attenuator.

Figure 6:
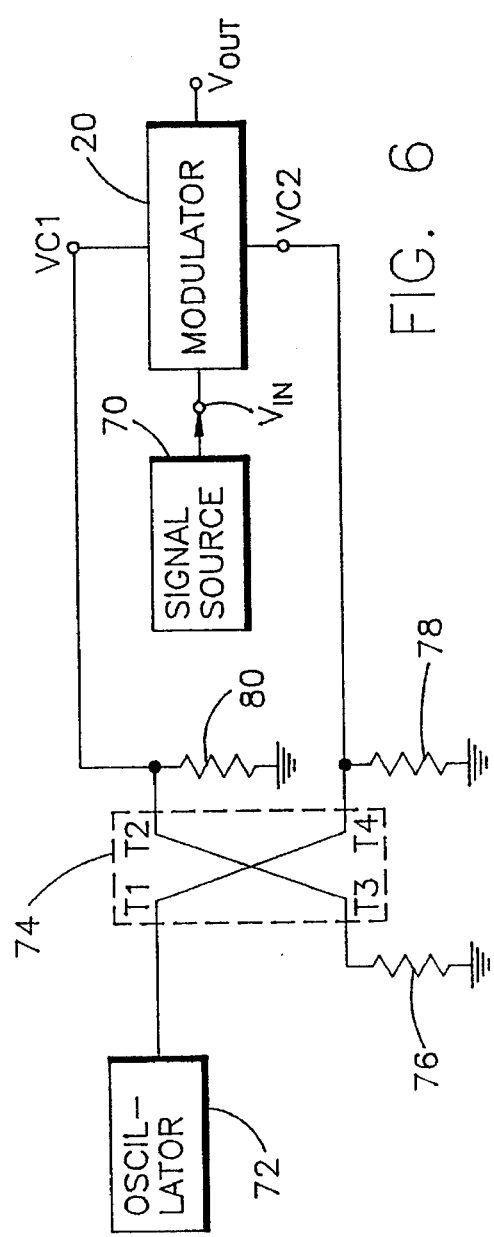
FIG. 6 is a block diagram showing connection of an oscillator to control terminals of the modulator for use of the modulator circuit as a converter of a carrier frequency of a microwave signal inputted to the modulator.

FIG. 6 shows use of the circuitry of the modulator 20 to provide an up-conversion or a down-conversion of a carrier frequency of a microwave signal of the source 70 by an amount of frequency provided in a reference sinusoidal signal of an oscillator 72. The oscillator 72 is connected by a Lange coupler 74 to the $V_{c1}$ and $V_{c2}$ control terminals of the modulator 20. The oscillator 72 is connected to the T1 terminal, of the coupler 74, the T2 terminal of the coupler 74 connects with the $V_{c1}$ terminal of the modulator 20, and the T4 terminal of the coupler 74 connects with the $V_{c2}$ terminal of the modulator 20. The coupler terminals T3, T4 and T2 are terminated with matched impedance loads provided, respectively, by resistors 76, 78 and 80. The oscillator 72 outputs an analog sinusoidal signal which is split evenly in power, but with phase quadrature between the $V_{c1}$ and the $V_{c2}$ signals. The tip of the vector R (FIG. 2) is made to rotate along an essentially circular path at an essentially constant rate, the direction of rotation depending on the connection between the coupler 74 and the modulator 20. One mode of connection for one direction of rotation is shown in FIG. 6. For the opposite direction of rotation, the connections of FIG. 6 are reversed such that the coupler terminal T2 connects with $V_{c2}$ and the coupler terminal T4 connects with $V_{c1}$. Thereby, the circuitry of the modulator provides yet another function, namely, the function of a single sideband frequency converter.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A multifunction modulator circuit comprising:
   means for splitting an electromagnetic signal into two component signals;
   means for inducing a phase quadrature relationship between the two component signals;
   means for adjusting the amplitude of each of the two component signals through a range of values including both positive and negative values; and
   summing means for vectorially combining said two component signals to provide a modified signal;
   wherein said adjusting means comprises a first circuit cell operative with a first of said component signals in response to a first control signal, and a second circuit cell operative with a second of said component signals in response to a second control signal, each of said circuit cells having a four-terminal device comprising:
   a first terminal for receiving one of said component signals, a second terminal to be loaded with a load;

a third terminal for outputting a reflected signal to said summing means, and a fourth terminal to be loaded with a load, wherein a magnitude and a sense of said reflected signal depends on a loading of said second terminal and a loading of said fourth terminal, said reflected signal being proportional to said one of said component signals received at said first terminal; and means responsive to one of said control signals for loading said second and said fourth terminals with a load to provide the magnitude and the sense of said reflected signal;

wherein in said first circuit cell said four-terminal device is a Lange coupler, said loading means comprises a first field effect transistor coupled to said second terminal and a second field effect transistor coupled to said fourth terminal, each of said transistors of said first circuit cell being biased with said first control signal to serve as a resistor, said first circuit cell having a first bias resistor and a second bias resistor connected respectively to gate terminals of said first and said second transistors for applying said first control signal to said first and said second transistors;

in said second circuit cell said four-terminal device is a Lange coupler, said loading means comprises a first field effect transistor coupled to said second terminal and a second field effect transistor coupled to said fourth terminal, each of said transistors of said second circuit cell being biased with said second control signal to serve as a resistor, said second circuit cell having a first bias resistor and a second bias resistor connected respectively to gate terminals of said first and said second transistors for applying said second control signal to said first and said second transistors; and in each of said first and second circuit cells, resistances of said first and second bias resistors have values greater by an order of magnitude than a characteristic impedance of transmission lines of said first and second circuit cells.

2. A modulator circuit according to claim 1 wherein said modified signal is a phase shifted signal.

3. A modulator circuit according to claim 1 further comprising an input Lange coupler, wherein said splitting means and said phase quadrature inducing means are included within said input Lange coupler.

4. A modulator circuit according to claim 3 wherein said summing means comprises a Wilkinson coupler.

5. A modulator circuit according to claim 1 wherein said splitting means comprises a Wilkinson coupler.

6. A modulator circuit according to claim 5 further comprising an output Lange coupler, wherein said summing means and said quadrature means are included within said output Lange coupler.

7. A modulator circuit according to claim 1 wherein said modified signal can be represented by a vector having any direction within a range of 360 degrees, said modified signal being a phase shifted signal; and wherein said first control signal has a constant value and said second control signal has a constant value to provide said phase shifted signal.

8. A modulator circuit according to claim 1 wherein said modified signal is an attenuated signal.

9. A modulator circuit according to claim 1 wherein said modified signal has phase modulation.

10. A modulator circuit according to claim 1 wherein said modified signal has amplitude modulation.

11. A modulator circuit according to claim 1 wherein said modified signal is a single side-band frequency converted signal.

12. A modulator circuit according to claim 1 wherein said modified signal can be represented by a vector having any direction within a range of 360 degrees, said modified signal being an attenuated signal; wherein said first control signal has a constant value and said second control signal has a constant value to provide said attenuated signal.

13. A modulator circuit according to claim 1 wherein said modified signal can be represented by a vector having any direction within a range of 360 degrees, said modified signal being a modulated signal having phase and amplitude modulation; wherein said first control signal has a time-varying value and said second control signal has a time-varying value to provide said modulated signal.

14. A modulator circuit according to claim 1 wherein said modified signal can be represented by a vector having any direction within a range of 360 degrees, said modified signal being a single side-band frequency converted signal; wherein said first control signal is a sinusoid and said second control signal is a sinusoid in phase quadrature with said first control signal to provide said frequency-converted signal.

15. A method of operating a multifunction modulator circuit comprising the steps of:

splitting an electromagnetic signal into two component signals;

inducing a phase quadrature relationship between the two component signals;

adjusting the amplitude of each of the two component signals through a range of values including both positive and negative values;

combining said component signals by a vectorial summation to provide a modified signal;

wherein said adjusting step comprises applying a first of the component signals to a first circuit cell and a second of the component signals to a second circuit cell; and in each of the respective circuit cells, processing the respective component signal by transmitting the component signal through a Lange coupler, loading the Lange coupler with a field effect transistor which presents an impedance to the Lange coupler, and regulating the impedance by a control signal at a gate terminal of the transistor;

wherein said step of regulating the impedance comprises a step of connecting the control signal via a bias resistor to the gate terminal of the transistor in a respective one of the circuit cells, and a further step of providing to the bias resistor a resistance having a value greater by an order of magnitude than a characteristic impedance of a transmission line in said respective one of the circuit cells.

16. A multifunction modulator circuit comprising:

means for splitting an electromagnetic signal into two component signals;

means for inducing a phase quadrature relationship between the two component signals;

means for adjusting the amplitude of each of the two component signals through a range of values including both positive and negative values; and summing means for vectorially combining said two component signals to provide a modified signal;

wherein said adjusting means comprises a first circuit cell operative with a first of said component signals in response to a first control signal, and a second circuit cell operative with a second of said component signals in response to a second control signal, each of said circuit cells having a four-terminal device comprising:

a first terminal for receiving one of said two component signals, a second terminal to be loaded with a load; a third terminal for outputting a reflected signal to said summing means, and a fourth terminal to be loaded with a load, wherein a magnitude and a sense of said reflected signal depends on a loading of said second terminal and a loading of said fourth terminal, said reflected signal being proportional to said one of said two component signals received at said first terminal; and means responsive to one of said first and second control signals for loading said second and said fourth terminals with a load to provide the magnitude and the sense of said reflected signal;

wherein in said first circuit cell said four-terminal device is a coupler for the electromagnetic signal, said loading means comprises a first transistor coupled to said second terminal and a second transistor coupled to said fourth terminal, each of said transistors of said first circuit cell being biased with said first control signal to serve as a resistor, said first circuit cell having a first bias resistor and a second bias resistor connected respectively to gate terminals of said first and said second transistors for applying said first control signal to said first and said second transistors; and in said second circuit cell said four-terminal device is a coupler for the electromagnetic signal, said loading means comprises a first transistor coupled to said second terminal and a second transistor coupled to said fourth terminal, each of said transistors of said second circuit cell being biased with said second control signal to serve as a resistor, said second circuit cell having a first bias resistor and a second bias resistor connected respectively to gate terminals of said first and said second transistors for applying said second control signal to said first and said second transistors; and in each of said cells, resistances of said first and second bias resistors have values greater by an order of magnitude than a characteristic impedance of transmission lines of said first and second circuit cells.

\* \* \* \* \*